US010615262B2

(12) United States Patent
Lin et al.

(10) Patent No.: US 10,615,262 B2
(45) Date of Patent: Apr. 7, 2020

(54) TRANSISTOR ARRAY SUBSTRATE AND DISPLAY PANEL USING THE SAME (71) Applicant: Innolux Corporation, Miao-Li County (TW)

(72) Inventors: Chun-Liang Lin, Miao-Li County (TW); Bo-Chin Tsuei, Miao-Li County (TW); Hung-Kun Chen, Miao-Li County (TW); Nai-Fang Hsu, Miao-Li County (TW); Yi-Ching Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 42 days.

(21) Appl. No.: 15/443,411

(22) Filed: Feb. 27, 2017

(65) Prior Publication Data

US 2017/0256620 A1 Sep. 7, 2017

(30) Foreign Application Priority Data

Mar. 2, 2016 (TW) .............................. 105106315 A (51) Int. Cl.
*H01L 29/417* (2006.01)
*H01L 29/786* (2006.01)
(Continued)

(52) U.S. Cl.
CPC .... *H01L 29/41733* (2013.01); *H01L 27/1214* (2013.01); *H01L 29/41775* (2013.01);
(Continued)

(58) Field of Classification Search
USPC ........................................................ 257/72
See application file for complete search history.

(56) References Cited

U.S. PATENT DOCUMENTS 8,729,544 B2 * 5/2014 Yamazaki ........... H01L 27/1225
257/43
2004/0263706 A1 * 12/2004 Cho .................. G02F 1/136286
349/43
(Continued)

FOREIGN PATENT DOCUMENTS

CN 103348484 A 10/2013

OTHER PUBLICATIONS

Taiwanese Office Action dated Sep. 19, 2016.
Chinese Office Action dated Apr. 23, 2019.

*Primary Examiner* — Zandra V Smith
*Assistant Examiner* — Lawrence C Tynes, Jr.
(74) *Attorney, Agent, or Firm* — Rabin & Berdo, P.C.

(57) ABSTRACT

A display panel comprises a first substrate, a second substrate, a display layer and transistors. One of the transistors includes a gate electrode disposed on the base plate, a first insulating layer disposed on the gate electrode, an active layer disposed on the first insulating layer, and a source electrode and a drain electrode disposed on the active layer, wherein the active layer includes a channel region between the source electrode and the drain electrode. At least one of the source and drain electrodes includes a first conductive layer disposed on the active layer, and a second conductive layer disposed on and contacting the first conductive layer, wherein the second conductive layer exposes a portion of top surface of the first conductive layer so that the first conductive layer possesses a first protrusion portion protruding from the edge of the second conductive layer and extending towards the channel region.

18 Claims, 7 Drawing Sheets

(51) Int. Cl.
*H01L 27/12* (2006.01)
*H01L 29/66* (2006.01)
*G02F 1/1368* (2006.01)
*H01L 27/32* (2006.01)

(52) U.S. Cl.
CPC .. *H01L 29/66969* (2013.01); *H01L 29/78618* (2013.01); *H01L 29/78696* (2013.01); *G02F 1/1368* (2013.01); *H01L 27/3262* (2013.01)

(56) References Cited

U.S. PATENT DOCUMENTS

| | | |
|---|---|---|
| 2007/0072439 A1* | 3/2007 | Akimoto ............ H01L 27/1225 438/795 |
| 2010/0025679 A1 | 2/2010 | Yamazaki et al. |
| 2012/0043543 A1* | 2/2012 | Saito ................ H01L 29/66765 257/57 |
| 2014/0021466 A1 | 1/2014 | Yamazaki et al. |
| 2014/0034947 A1* | 2/2014 | Moriguchi .......... H01L 29/7869 257/43 |
| 2015/0206982 A1 | 7/2015 | Moon et al. |

* cited by examiner

TRANSISTOR ARRAY SUBSTRATE AND DISPLAY PANEL USING THE SAME

This application claims the benefit of Taiwan application Serial No. 105106315, filed Mar. 2, 2016, the subject matter of which is incorporated herein by reference.

BACKGROUND

Field of the Invention

The disclosure relates in general to a transistor array substrate and display panel using the same, and more particularly to a transistor array substrate with a metal layer having bilayer structure and display panel using the same, which improves the electrical characteristics and reliability of the display panel.

Description of the Related Art

Today, electronic products with display panels, such as smart phones, tablet personal computers (i.e. tablet PC, flat PC, ex: iPad), laptops, monitors, and televisions, are necessary tools for work and leisure in the daily life. Liquid crystal display (LCD) panel is the most popular display panel in use. For a LCD panel applicable to a flat display, an electronic visual display and an image display, the liquid crystal molecules aligned between two transparent electrodes rotate continuously depending on the polarity and magnitude of the electric field when the electric field is applied, and different gray scale expression can be adjusted and realized by varying the applied voltage.

During fabrication of the display panel, the related factors such as the patterns and sizes of the metal layers and the semiconductor layers have to be considered to form the precise configurations, so that the stable electrical properties of the device of the display panel can be maintained to meet the requirements of the commercial products in applications, such as high transmittance, high production yield, good reliability of electrical characteristics and stable displaying quality. The faulty designs of the related components and material layers of the display panel would lead to the decreases of the electrical performance, and have considerable effects on the displaying quality.

SUMMARY

The disclosure is related to a transistor array substrate and display panel using the same, which provides a metal layer with bilayer structure to improve the electrical characteristics and reliability of the display panel.

According to one embodiment of the disclosure, a display panel comprising a first substrate, second substrate, display layer and a plurality of transistors is provided, transistors disposed on a base plate. One of the transistors comprises a gate electrode disposed on the base plate, a first insulating layer disposed on the gate electrode, an active layer disposed on the first insulating layer and having a channel region, a source electrode and a drain electrode disposed on the active layer. At least one of the source electrode and the drain electrode comprises a first conductive layer disposed on the active layer, and a second conductive layer disposed on the first conductive layer and contacting the first conductive layer, wherein the second conductive layer exposes a portion of top surface of the first conductive layer, and the first conductive layer has a first protrusion portion protruding from an edge of the second conductive layer, and the first protrusion portion extends towards the channel region.

According to one embodiment of the disclosure, a transistor array substrate is provided, comprising a base plate, wherein a plurality of transistors of the substrate are disposed on the base plate, and one of the transistors has aforementioned structure.

The above and other aspects of the disclosure will become better understood with regard to the following detailed description of the preferred but non-limiting embodiments. The following description is made with reference to the accompanying drawings.

DETAILED DESCRIPTION

In the embodiment of the present disclosure, a transistor array substrate and a display panel using the same are disclosed, by providing a particular design of the transistor substrate which possesses a second metal layer with bilayer structure to prevent the penetration of metal ions diffusing into the related layers in the channel region, thereby improving the electrical characteristics and reliability of the display panel. Accordingly, the production yield of the display panel manufactured by the design of the embodiments is increased. Also, the transistor array substrates of the embodiments still meet the requirements of the commercial products in applications, and the methods for manufacturing the embodied display panels are compatible with the current process. Accordingly, the transistor array substrates of the embodiments not only possess stable and reliable electrical characteristics, but also suit for mass production.

The embodiments are described in details with reference to the accompanying drawings. The embodiment of the present disclosure can be applied to a liquid crystal display (LCD) panel having a back-channel-etch type thin film transistor (BCE-type TFT) array substrate. In other embodiment, a light emitting diode display panel with top gate type thin film transistor could be applied. It is noted that the details of the structures of the embodiments are provided for exemplification, and the described details of the embodiments are not intended to limit the present disclosure. It is noted that not all embodiments of the invention are shown. Modifications and variations can be made without departing from the spirit of the disclosure to meet the requirements of the practical applications. Thus, there may be other embodiments of the present disclosure which are not specifically illustrated. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense. Also, the identical and/or similar elements of the embodiments are designated with the same and/or similar reference numerals.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
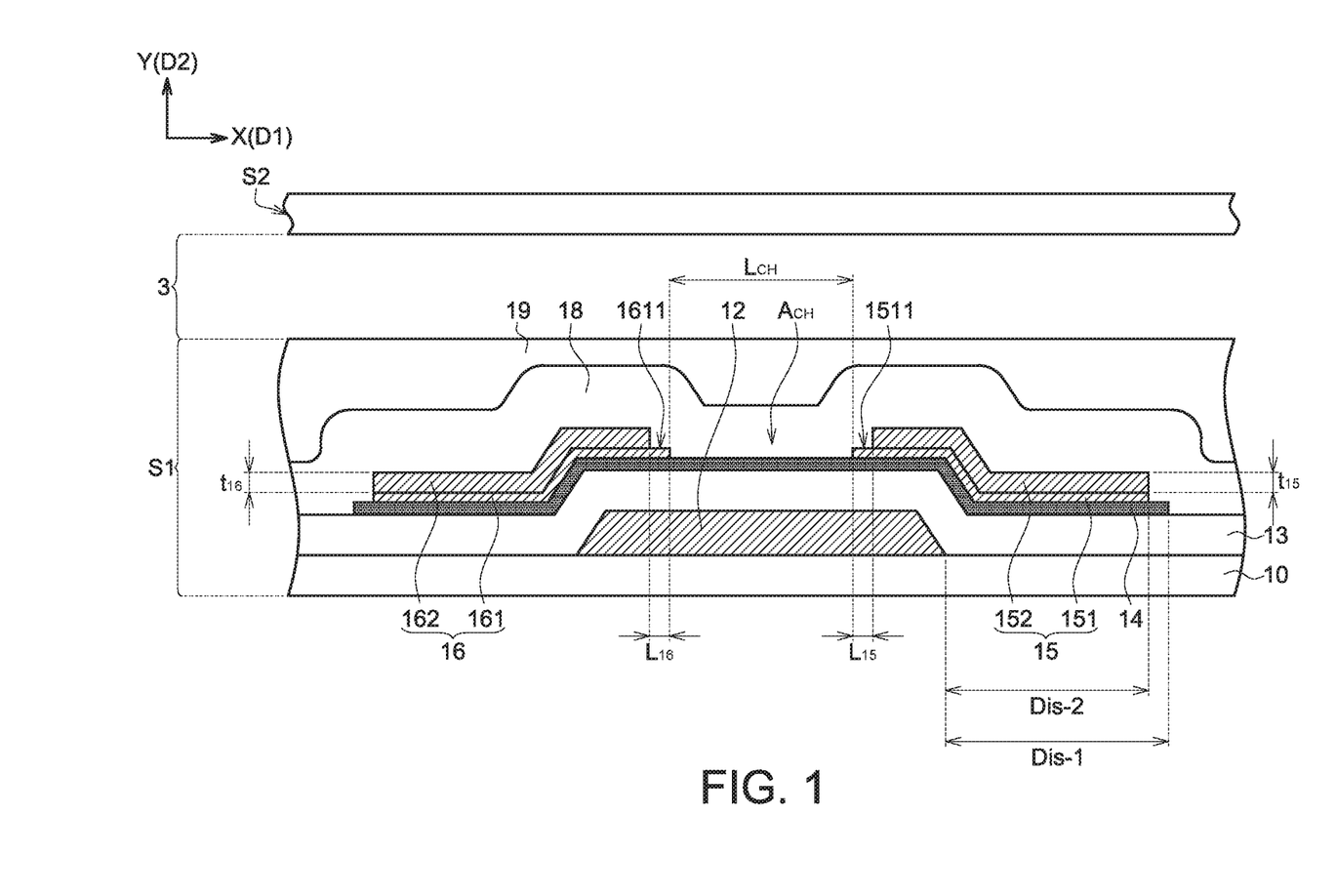
FIG. 1 is a cross-sectional view of a liquid crystal display (LCD) panel with a transistor array substrate according to an embodiment of the present disclosure.

FIG. 1 is a cross-sectional view of a liquid crystal display (LCD) panel with a transistor array substrate according to an embodiment of the present disclosure. A display panel comprises a first substrate S1, a second substrate S2 disposed oppositely to the first substrate S1, and a display layer 3 disposed between the first substrate S1 and the second substrate S2. In one embodiment, the first substrate S1 is a transistor array substrate, the second substrate S2 is a color filter substrate, and the display layer 3 is a liquid crystal layer. In another embodiment, the first substrate S1 is a transistor array substrate, the second substrate S2 is a transparent substrate, and the display layer 3 could be a plurality of organic light emitting diodes, a plurality of quantum dot light emitting diodes, or a plurality of inorganic light emitting diodes. In this embodiment, the source electrode and the drain electrode (i.e., the second metal layer) directly disposed on the active layer and positioned at two opposite sides of the channel region are exemplified for illustrating the structural details of the first substrate S1; however, the disclosure is not limited to this configuration and structural details. Also, the elements of the second substrate S2 are omitted for the purpose of simplification.

The first substrate S1 comprises several transistors disposed on a base plate 10. The base plate 10 could be made by the hard material (such as glass) or the soft material (such as plastic). As shown in FIG. 1, one of the transistors comprises a gate electrode 12 disposed on the base plate 10, a first insulating layer 13 disposed on the gate electrode 12 as a gate insulating layer, an active layer 14 disposed on the first insulating layer 13 and a portion of the active layer 14 is corresponding to the gate electrode 12. The active layer 14 having a channel region $A_{CH}$ induced by the gate electrode, and the channel region $A_{CH}$ is disposed between a source electrode 15 and a drain electrode 16. According to the embodiment, at least one of the source electrode and the drain electrode comprises at least two conductive layers. In this embodiment, both of the source electrode 15 and the drain electrode 16 are designed by forming two conductive layers for illustration. However, the disclosure is not limited thereto.

In one embodiment, the active layer 14 can be disposed by metal oxide semiconductor material, and metal material examples of the metal oxide include (but not limited to) indium (In), gallium (Ga), zinc (Zn), tin (Sn), aluminum (Al), and a combination thereof. For example, the active layer 14 can be an indium zinc oxide (IZO) layer, or an indium gallium zinc oxide (IGZO) layer, or a zinc tin oxide (ZSO) layer, etc. In other embodiment, the active layer 14 can be disposed by silicon base semiconductor, such as poly-silicon or amorphous silicon. Also, a second insulating layer 18 covers the source electrode 15 and the drain electrode 16 as a passivation layer, and a third insulating layer 19 disposed on the second insulating layer 18 as a planarization layer. The first insulating layer 13, the second insulating layer 18 and the third insulating layer 19 can be a single layer structure or a multilayer structure. The first insulating layer 13, the second insulating layer 18 and the third insulating layer 19 can be disposed by the organic materials or the inorganic materials. In one example, the organic material can be (but not limited to) perfluoroalkoxy (PFA). Inorganic material can be (but not limited to) oxides (such as silicon oxide and aluminum oxide), nitrides (such as silicon nitride), or nitrogen oxides (such as nitrogen silicon oxide).

As shown in FIG. 1, the source electrode 15 includes a first conductive layer 151 disposed on the active layer 14, and a second conductive layer 152 disposed on the first conductive layer 151, and the second conductive layer 152 contacts the first conductive layer 151. The first conductive layer 151 contacts a portion of top surface of the active layer 14 and a portion of lateral surface of the active layer 14. The second conductive layer 152 exposes a portion of top surface of the first conductive layer 151, and the first conductive layer 151 has a first protrusion portion 1511 protruding from an edge of the second conductive layer 152, wherein the first protrusion portion 1511 extends towards the channel region $A_{CH}$.

Similarly, the drain electrode 16 includes a first conductive layer 161 disposed on the active layer 14, and a second conductive layer 162 disposed on the first conductive layer 161, and the second conductive layer 162 contacts the first conductive layer 161. The first conductive layer 161 contacts a portion of top surface of the active layer 14 and a portion of lateral surface of the active layer 14. The second conductive layer 162 exposes a portion of top surface of the first conductive layer 161, and the first conductive layer 161 has a first protrusion portion 1611 protruding from an edge of the second conductive layer 162, wherein the first protrusion portion 1611 extends towards the channel region $A_{CH}$. The first protrusion portion 1511 and the first protrusion portion 1611 are opposite to each other.

In one embodiment, the source electrode 15 and the drain electrode 16 can be disposed by copper (Cu), aluminum (Al), titanium (Ti) or molybdenum (Mo) as an bilayer structure material, which means that the first conductive layer 151/161 as the lower conductive layer may comprise titanium or molybdenum, while the second conductive layer 152/162 as the upper conductive layer may comprise copper or aluminum. The lower conductive layer such as Ti or Mo has a first protrusion portion 1511/1611 protruding from an edge of the upper conductive layer 162 such as Cu or Al. The configuration of the first protrusion portion 1511/1611 in the embodiment for meeting the requirements of application product can be achieved by adjusting process conditions, for example, adjusting related parameters of the length of the first protrusion portion and/or the angle between the sidewall and the bottom surface of the first protrusion portion.

In one embodiment, the first protrusion portion 1511/1611 of the lower conductive layer (ex: lower metal layer) protruding from an edge of the upper conductive layer (ex: upper metal layer) can be implemented by over-etching the upper conductive layer for exposing a portion of the top surface of the lower conductive layer during patterning (such as wet etching) the source electrode 15/the drain electrode 16 (i.e. the second metal layer), thereby preventing the undercut situation in the process of etching (such as wet etching or dry etching) the lower conductive layer. According to the experimental results, the etching time has been increased to 120%-200% times as compared with the original etching time during etching of the upper conductive layer (ex: Cu) enables to remove the portion of the upper conductive layer with a length equal to 20%-100% of the thickness of the upper conductive layer; therefore, the protrusion portion length of the upper conductive layer can be determined. Accordingly, in one embodiment, a length $L_{15}/L_{16}$ of the first protrusion portion 1511/1611 is equal to or greater than 20% of a thickness $t_{15}/t_{16}$ of the second conductive layer 152/162. A length $L_{15}/L_{16}$ of the first protrusion portion 1511/1611 is equal to or less than 100% of a thickness $t_{15}/t_{16}$ of the second conductive layer 152/162.

Moreover, when the second conductive layer 152/162 (i.e. the upper conductive layer) comprises Cu, and a silicon oxide ($SiO_2$) layer as the second insulating layer 18 deposited on the active layer (ex: IGZO) and covering the source electrode 15 and the drain electrode 16, the reaction of Cu and $SiO_2$ would generate copper oxide (CuO). Also, undesirable sputtering of copper oxide into the channel region $A_{CH}$ would occur, which has considerable effect on the electrical characteristics of the active layer (ex: IGZO) 14. Therefore, the embodied lower conductive layer design having the first protrusion portion 1511/161 protruding from an edge of the upper conductive layer lower conductive layer effectively prevents the oxides (produced by the insulating layer and the metal of the upper conductive layer) from getting access to the channel region $A_{CH}$.

In this embodiment, the channel region $A_{CH}$ has a channel length $L_{CH}$ along the first direction D1, and the first protrusion portion 1511/1611 extends towards the channel region $A_{CH}$ along the first direction D1, as shown in FIG. 1. In this embodiment, the first direction D1 denotes the direction of the channel length $L_{CH}$, such as the X-direction in FIG. 1. The length $L_{15}/L_{16}$ of the first protrusion portion 1511/1611 is defined as the length along the direction of the channel length $L_{CH}$ (i.e. the first direction D1).

Although the first protrusion portion 1511/1611 of the embodiment prevents copper oxides from getting access to the channel region $A_{CH}$, the overlong first protrusion portion 1511/1611 would increase the overlapping area between the source electrode 15/the drain electrode 16 and the gate electrode 12 beneath, thereby increasing the parasitic capacitance such as the capacitance between the gate electrode and the drain electrode located above (hereinafter, "Cgd") and the capacitance between the gate electrode and the source electrode located above (hereinafter, "Cgs"). The increase of Cgd increases the feed through voltage of the pixel, and the increase of Cgs increases the RC (multiplication of resistance by capacitance) loading of the data line. Therefore, the optical maximum length of the first protrusion portion 1511/1611 can be determined according to the actual needs of applying product such as requirements and limitations of the electrical characteristics. One of the applications is provided below; however, those numerical values are disclosed for illustration, not for limitation.

Figure 2A:
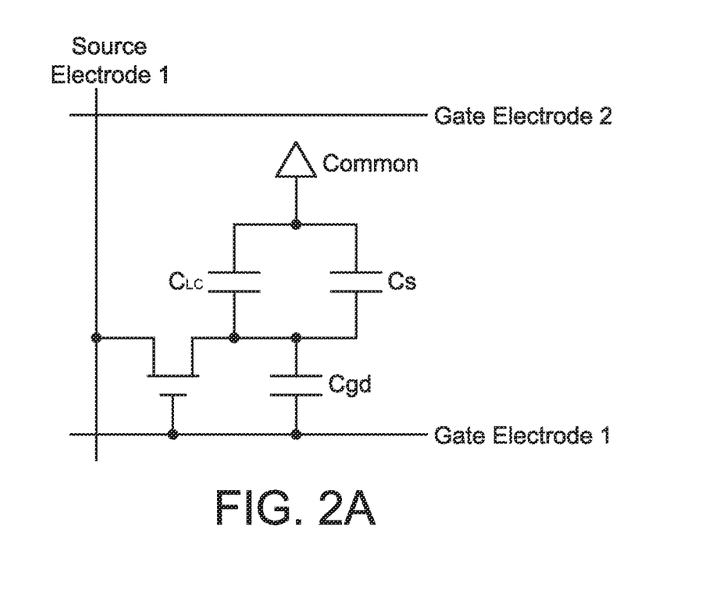
FIG. 2A is a circuit diagram of a pixel.
Figure 2B:
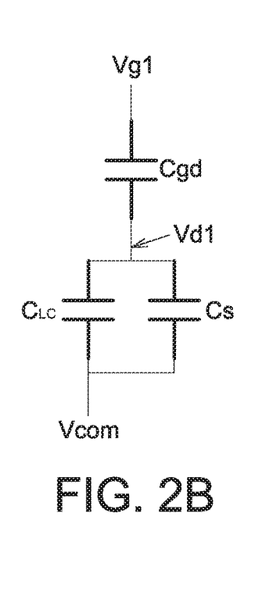
FIG. 2B is an equivalent circuit diagram when the gate electrode turns on the transistor.
Figure 2C:
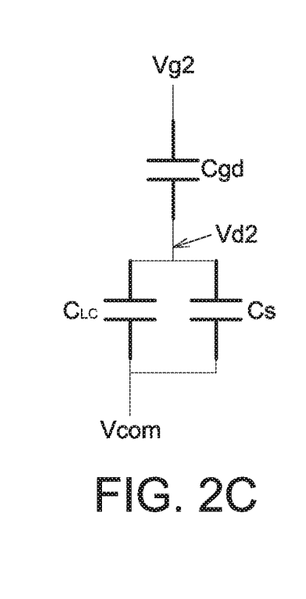
FIG. 2C is an equivalent circuit diagram when the gate electrode turns off the transistor.

In one example, a fringe-field switching (FFS) liquid crystal display is provided as an illustration, and the related parameters include: a pixel size of 21 nm×63 nm, the positive voltage $V_{GH}$ of 16V to turn on the TFT, the negative voltage $V_{GL}$ of −12V to turn off the TFT, the feed through voltage of −0.95V allowable for middle gray of the pixel, the capacitance between the gate electrode and the drain electrode of 0.006 picofarad (pF) during TFT off (Cgd_off) and of 0.0066 pF during TFT on (Cgd_on), the storage capacitance CS of 0.193 pF, and the liquid crystal capacitance CLC of 0 pF approximately. FIG. 2A is a circuit diagram of a pixel. FIG. 2B is an equivalent circuit diagram when the gate electrode turns on the transistor. FIG. 2C is an equivalent circuit diagram when the gate electrode turns off the transistor. According to FIG. 2A-FIG. 2C and law of conservation of charge: $(V_{d1}-V_{g1})*Cgd+(V_{d1}-V_{COM})*(Cs+C_{LC})=(V_{d2}-V_{g2})*Cgd+(V_{d2}-V_{COM})*(Cs+C_{LC})$.

The feed through voltage $(V_{d2}-V_{d1})$ can be represented as the equation (1):

$$(V_{d2}-V_{d1})=(V_{g2}-V_{g1})*Cgd/(Cgd+Cs+C_{LC}) \quad (1).$$

According to the related parameters of the exemplified FFS LC display above, the actual feed through voltage $(V_{d2}-V_{d1})$ can be obtained by using the equation (1), and the calculation of $(V_{d2}-V_{d1})$ is represented as: $(-12-16)*0.006/(0.006+0.193+0)=-0.844221106(V)$.

Additionally, a maximum allowable parasite capacitance Cg can be obtained, by using the equation (1) and the feed through voltage of −0.95V allowable for middle gray of the pixel (also replaced by the values: $V_{g2}=-12$, $V_{g1}=16$, Cs=0.193, $C_{LC}=0$). The maximum allowable parasite capacitance Cg is 0.006778189 pF.

Thus, in this exemplified FFS LC display applied the protrusion portion design of the embodiment, an allowable increased ratio of the parasite capacitance (compared to the FFS LC display without the embodied design) is 1.12969809(=0.006778189/0.006); i.e. about 113%.

Figure 3:
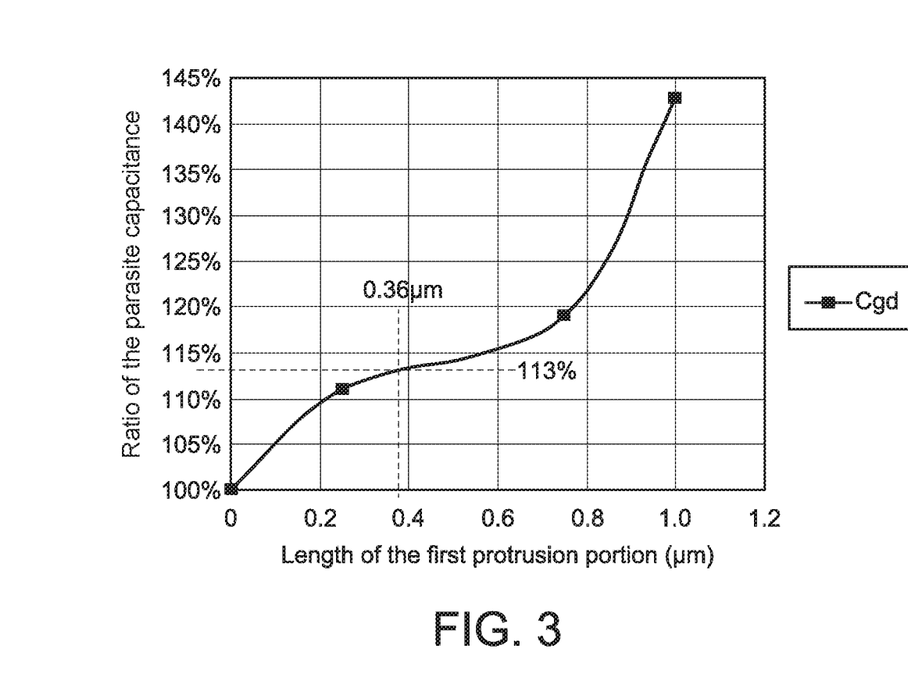
FIG. 3 shows a curve of relationship between the length of the first protrusion portion and the ratio of the parasite capacitance according to an embodiment of the present disclosure.

FIG. 3 shows a curve of relationship between the length of the first protrusion portion and the ratio of the parasite capacitance according to an embodiment of the present disclosure. In FIG. 3, x-axis is the length of the first protrusion portion, wherein "0" means no first protrusion portion disposed in the structure. According to the curve of FIG. 3 and the allowable ratio of the parasite capacitance of about 113%, it is found that the length of the first protrusion portion is about 0.36 μm related to 113% of the parasite capacitance. In one embodiment, the length $L_{15}/L_{16}$ of the first protrusion portion 1511/1611 (along the direction of the channel length $L_{CH}$ (i.e. the first direction D1) as shown in FIG. 1) is substantially equal to or less than 0.36 μm.

It is known to people skilled in the art that the foregoing description merely illustrates how to design the first protrusion portion in one of the applications, and the present disclosure is not limited to the numeral values or ranges disclosed above. The appropriate values of the related parameters of the first protrusion portion should be selected and determined based on the requirements such as the electrical characteristics and limitations (ex: the calculations provided above) of the product in practical applications.

Figure 4:
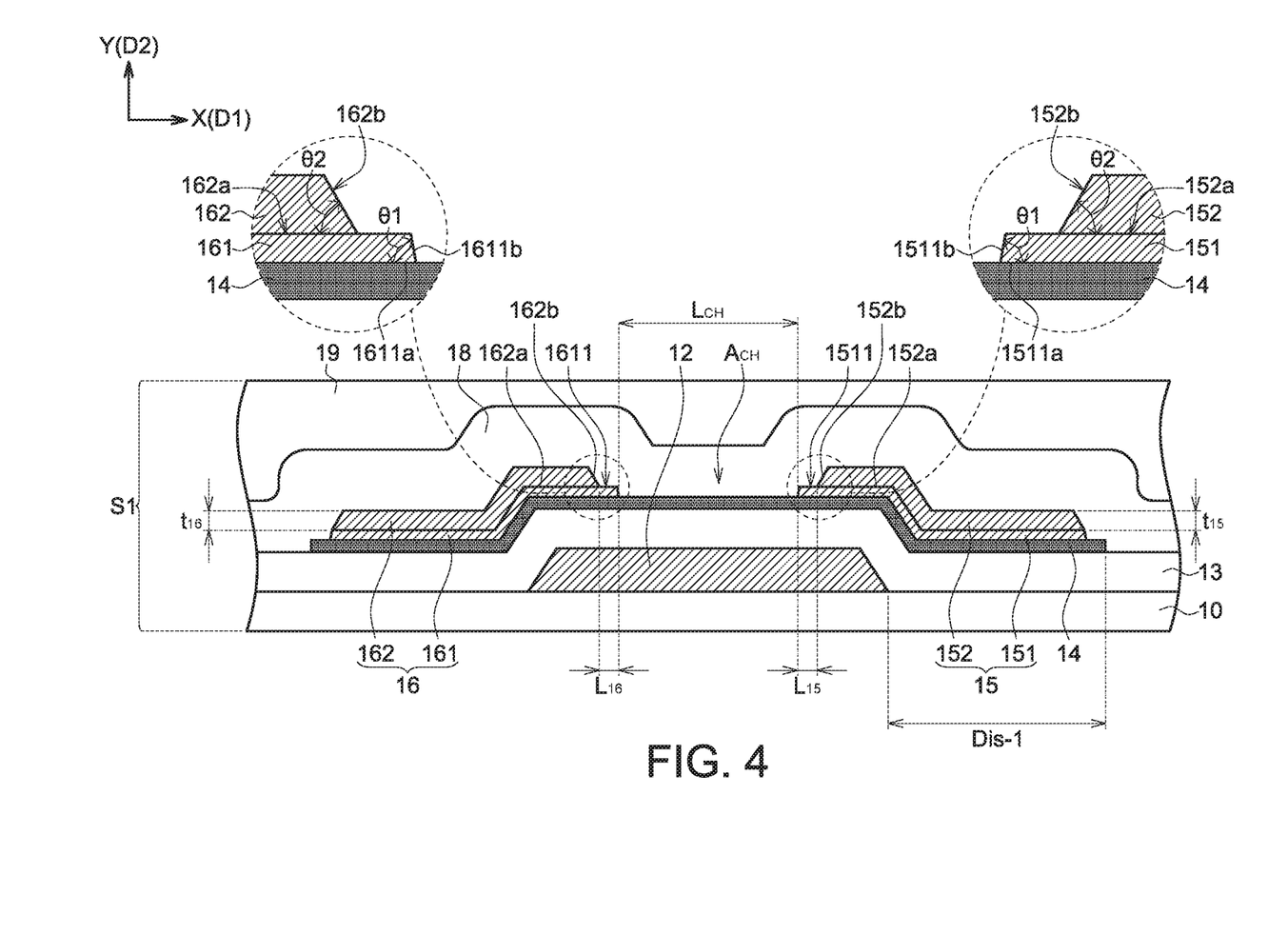
FIG. 4 is a cross-sectional view of a transistor array substrate according to another embodiment of the present disclosure.

Moreover, if the source electrode 15/the drain electrode 16 with a bilayer structure is constructed, the upper and lower conductive layers may have sidewalls with different slanted angles. FIG. 4 is a cross-sectional view of a transistor array substrate according to another embodiment of the present disclosure. In the fabrication of the bilayer source electrode 15/the drain electrode 16 according to one embodiment, the second conductive layer 152/162 (at the upper position) can be patterned by wet etching, followed by patterning the first conductive layer 151/161 (at the lower position) by dry etching, so that the first protrusion portion 1511/1611 can be disposed by protruding from an edge of the second conductive layer 152/162. As shown in FIG. 4, the first protrusion portion 1511/1611 has the first sidewall 1511b/1611b and the first bottom surface 1511a/1611a, and the second conductive layer 152/162 has a second sidewall 152b/162b and the second bottom surface 152a/162a, wherein the second sidewall 152b/162b is adjacent to the channel region $A_{CH}$. An angle θ1 between the first sidewall 1511b/1611b and the first bottom surface 1511a/1611a is greater than an angle θ2 between the second sidewall 152b/162b and the second bottom surface 152a/162a.

In one embodiment, when the second conductive layer 152/162 (at the upper position) is patterned by wet etching, the angle θ2 can be in a range of 30 degrees to 60 degrees. In one embodiment, when the first conductive layer 151/161 (at the lower position) is patterned by dry etching, the angle θ1 can be 80 degrees or more.

Figure 5:
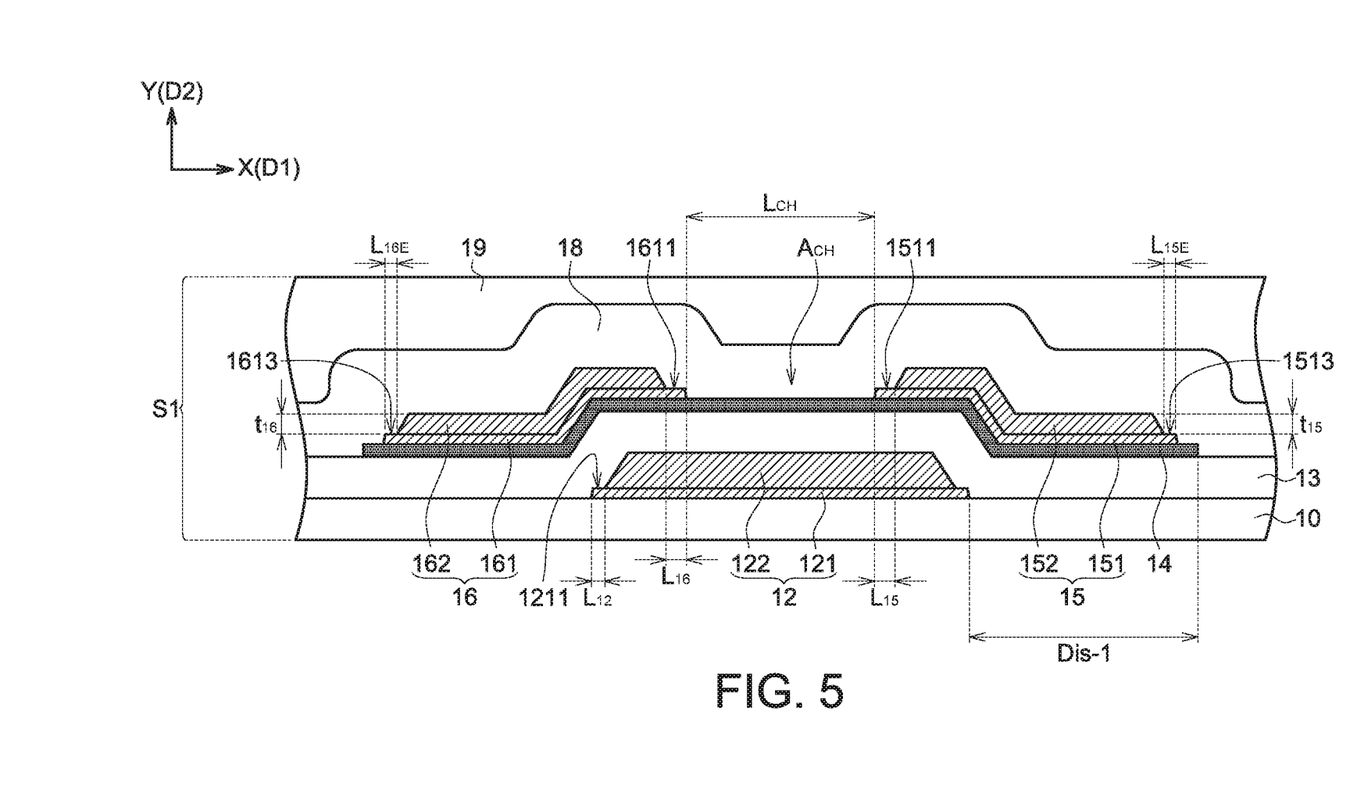
FIG. 5 is a cross-sectional view of a transistor array substrate according to a further embodiment of the present disclosure.

Additionally, in one embodiment, the gate electrode 12 can be disposed as a bilayer structure having the similar design of the protrusion portions, so as to prevent the chamfer edge of the lower conductive layer (such as a Ti layer or Mo layer, and the upper conductive layer could be a copper layer or a Al layer) of the gate electrode 12 during patterning. FIG. 5 is a cross-sectional view of a transistor array substrate according to a further embodiment of the present disclosure. As shown in FIG. 5, the gate electrode 12 includes a lower conductive layer 121 and an upper conductive layer 122. The lower conductive layer 121 is disposed on the base plate 10, and the upper conductive layer 122 is disposed on the lower conductive layer 121, wherein the lower conductive layer 121 has a second protrusion portion 1211 protruding from an edge of the upper conductive layer 122. Please refer to FIG. 1 and related descriptions for other elements in FIG. 5, and the details of other elements are not redundantly repeated.

Additionally, in one embodiment, the lower conductive layer 151/161 of at least one of the source electrode 15 and the drain electrode 16 has the other protrusion portion away from the channel region $A_{CH}$. For example, the source electrode 15 and the drain electrode 16 in FIG. 5 have the third protrusion portions 1513 and 1613 at the positions away from the channel region $A_{CH}$, respectively. The third protrusion portions 1513 and 1613 have the lengths $L_{15E}$ and $L_{16E}$, respectively. Similarly, an angle between the sidewall and the bottom surface of the third protrusion portions 1513/1613 can be greater than the angle of the sidewall (away from the channel region $A_{CH}$) and the bottom surface of the upper conductive layer (i.e. the second conductive layer 152/162) of the source electrode 15/the drain electrode 16. Please refer to the related descriptions above, and the details are not redundantly repeated.

Additionally, considering the situations of the chamfer edge of the lower conductive layer of the source electrode 15/the drain electrode 16 and effectively prevents copper oxides accessing into the channel region $A_{CH}$ of the active layer (ex: IGZO)14, it can be designed that at least one of the length $L_{15}/L_{16}$ of the first protrusion portion 1511/1611 is greater than the length $L_{12}$ of the second protrusion portion 1211. As shown in FIG. 5, the lengths $L_{15}$ and $L_{16}$ of the first protrusion portions 1511 and 1611 are all greater than the length $L_{12}$ of the second protrusion portion 1211 of the gate electrode 12.

Figure 6A:
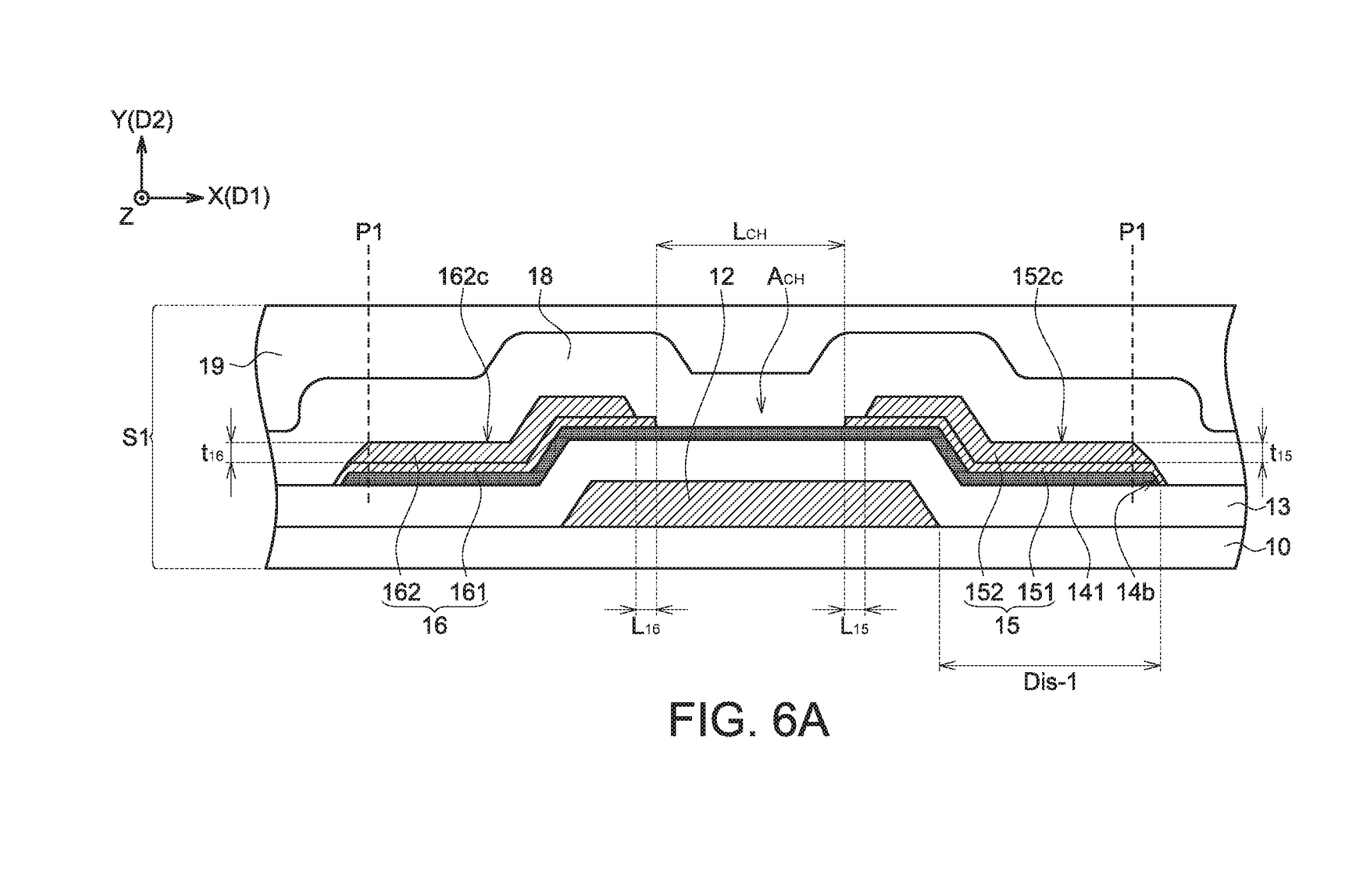
FIG. 6A and FIG. 6B are cross-sectional views of two applicable transistor array substrates according to other embodiments of the present disclosure.
Figure 6B:
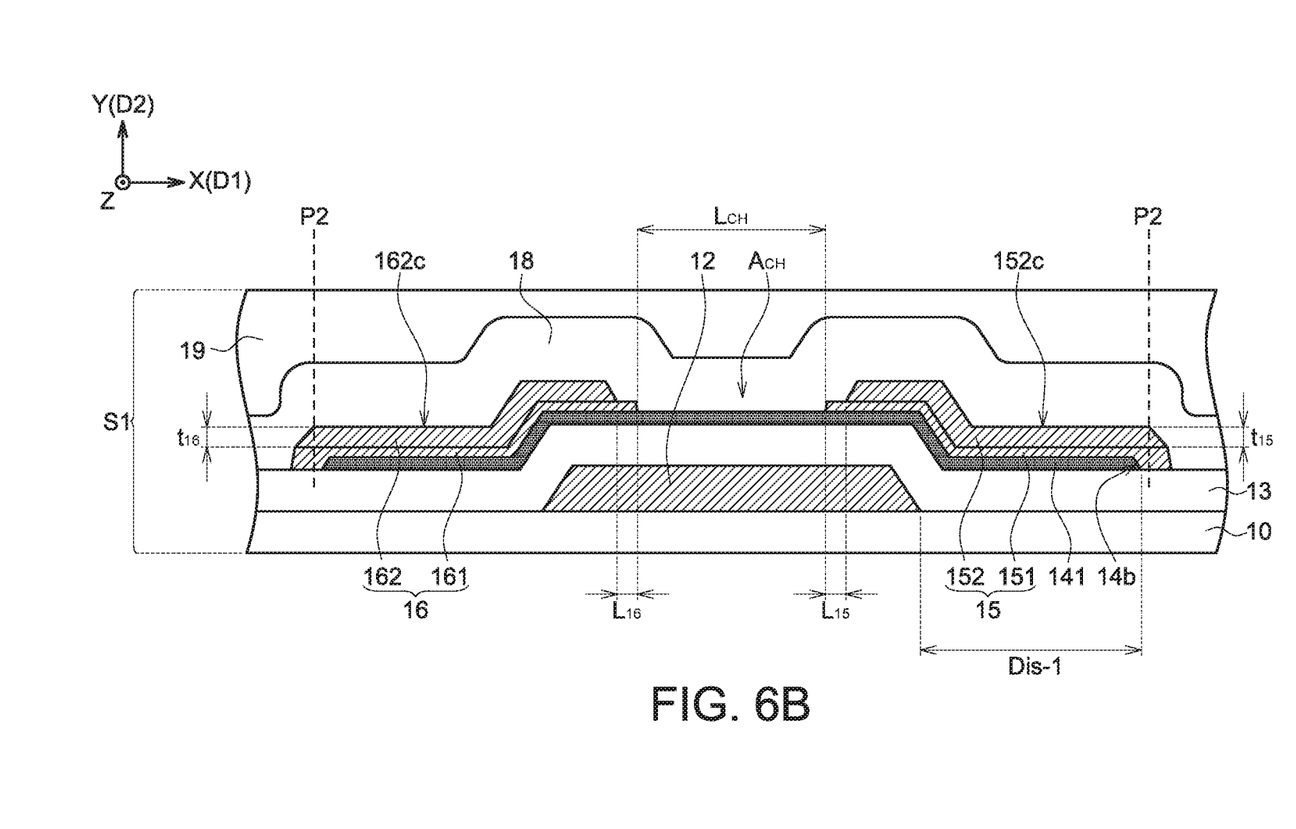

Additionally, there may be other embodiments of the present disclosure can be applied. FIG. 6A and FIG. 6B are cross-sectional views of two applicable transistor array substrates according to other embodiments of the present disclosure. In these embodiments, at least one of the source electrode 15 and the drain electrode 16 covers a lateral surface 14b of the active layer 14. As shown in FIG. 6A and FIG. 6B, the first conductive layers 151 and 161 of the source electrode 15 and the drain electrode 16 cover the lateral surface 14b of the active layer 14. In FIG. 6A, the first conductive layers 151 and 161 are adjacent to and cover the lateral surface 14b of the active layer 14, while the outer edges of the second conductive layers 152 and 162 are not corresponding to the lateral surface 14b of the active layer 14. Therefore, the outer edges of the top surfaces 152c and 162c of the second conductive layers 152 and 162 (indicated by the lines P1 in FIG. 6A) are not extended to the positions corresponding to the lateral surface 14b of the active layer 14. However, the disclosure is not limited to the configuration of FIG. 6A. In FIG. 6B, the second conductive layers 152 and 162 cover the lateral surface 14 of the active layer 14b, which means that the outer edges of the top surfaces 152c and 162c of the second conductive layers 152 and 162 (indicated by the lines P2 in FIG. 6B) are extended to the positions corresponding to the lateral surface 14b of the active layer 14; accordingly, when the substrate is viewed from the XZ-plane, the outer edges of the second conductive layers 152 and 162 extend beyond the lateral surface 14b of the active layer 14.

According to each of the aforementioned embodiments, the length of the active layer 14 is greater than the length of the gate electrode 12. As shown in FIG. 1, the outer edge of the active layer 14 away from the channel region $A_{ch}$ extends beyond an outer edge of the gate electrode 12, and both edges are apart from each other by a first distance Dis-1. Also, at least one of the outer edges of the source electrode 15 and the drain electrode 16 away from the channel region $A_{ch}$ extend beyond the outer edge of the gate electrode 12, and both edges are apart from each other by a second distance Dis-2. In one embodiment, the second distance Dis-2 is equal to or less than the first distance Dis-1. Although the second distance Dis-2 is less than the first distance Dis-1 according to the embodiment of FIG. 1, the disclosure is not limited thereto.

According to the embodiment, because of the outer edge of the active layer 14 away from the channel region $A_{ch}$ extending beyond an outer edge of the gate electrode 12, these beyond areas of the active layer 14 unshielded by the gate electrode 12 are irradiated by the backlight. In one embodiment, the active layer 14 comprises the material of metal oxide (such as IGZO), and the characteristic of this material has a tendency to the conductivity rather than semiconductivity under the backlight irradiation. Therefore, the electrical impedance of these beyond areas of the active layer 14 unshielded by the gate electrode 12 (i.e. the areas denoted by the first distance Dis-1 in FIG. 1) is less than the electrical impedance of the portion of the active layer 14 corresponding to the channel region $A_{ch}$. Moreover, the outer edges of the source electrode 15 and the drain electrode 16 extending beyond the outer edge of the gate electrode 12 also produce another beyond areas (i.e. the areas denoted by the second distance Dis-2 in FIG. 1) directly contacting by the portion (i.e. the areas denoted by the first distance Dis-1 in FIG. 1) of the active layer with low electrical impedance, thereby improving ohmic contact therebetween.

According to the aforementioned descriptions, the transistor array substrate and a display panel using the same are provided, wherein the transistor substrate comprises a second metal layer with bilayer structure, thereby preventing the penetration of metal oxides into the related layers in the channel region. Thus, the electrical characteristics and reliability of the transistor substrate can be improved, thereby increasing the production yield of the display panel in the application. It is known the exemplified structures and details such as related factors of the protruding portions of the embodiment (ex: the length of the first protruding portion 1511/1611 and/or the angles θ1/θ2 of related sidewalls) could be adjusted and changed to satisfy the actual needs of the practical applications. Thus, the numerical values in the embodiment are provided for illustration, not for limitation. Also, the transistor array substrates of the embodiments possess excellent electrical characteristics and meet the requirements of the commercial products in applications. Furthermore, the methods for manufacturing the embodied display panels are compatible with the current process, which is suitable for mass production.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
  a first substrate including a base plate;
  a second substrate disposed opposite to the first substrate;
  a display layer disposed between the first substrate and the second substrate; and
  a plurality of transistors disposed between the base plate and the display layer, wherein one of the plurality of transistors comprises:
    a gate electrode, disposed on the base plate;
    a first insulating layer, disposed on the gate electrode;
    an active layer, disposed on the first insulating layer, and the active layer having a channel region;
    a source electrode and a drain electrode disposed on the active layer; and
    a second insulating layer disposed on the source electrode and the drain electrode, wherein at least one of the source electrode and the drain electrode comprising:
      a first conductive layer, disposed on the active layer; and
      a second conductive layer, disposed on the first conductive layer, wherein
      the second conductive layer comprises copper;
    wherein the first conductive layer includes a first protrusion portion exposed by the second conductive layer, and the first protrusion portion has a first bottom surface and a first sidewall, and
    wherein the first bottom surface contacts the active layer, and the first sidewall contacts the second insulating layer;
    wherein the second conductive layer has a second sidewall and a second bottom surface, the second sidewall is adjacent to the channel region, wherein an angle $\theta 1$ between the first sidewall and the first bottom surface is greater than an angle $\theta 2$ between the second sidewall and the second bottom surface.

2. The display panel according to claim 1, wherein a length of the first protrusion portion is equal to or less than 0.36 μm.

3. The display panel according to claim 1, wherein a length of the first protrusion portion is ranged from 20% to 100% of a thickness of the second conductive layer.

4. The display panel according to claim 1, wherein the gate electrode comprises a lower conductive layer disposed on the base plate, and an upper conductive layer disposed on the lower conductive layer, wherein the lower conductive layer includes a second protrusion portion protruding from an edge of the upper conductive layer, and the second protrusion portion has a top surface exposed by the upper conductive layer.

5. The display panel according to claim 4, wherein a first length of the first protrusion portion is greater than a second length of the second protrusion portion.

6. The display panel according to claim 4, wherein the second insulating layer is silicon oxide.

7. The display panel according to claim 1, wherein an outer edge of the active layer extends beyond an outer edge of the gate electrode.

8. The display panel according to claim 1, wherein at least one of the source electrode and the drain electrode covers a portion of a lateral surface of the active layer.

9. The display panel according to claim 1, wherein the first conductive layer covers a portion of a lateral surface of the active layer.

10. The display panel according to claim 1, wherein the second conductive layer has a second sidewall and a second bottom surface, the first sidewall and the second sidewall are adjacent to the channel region, and an angle between the first sidewall and the first bottom surface is different from an angle between the second sidewall and the second bottom surface.

11. A transistor array substrate, comprising:
  a base plate; and
  a plurality of transistors disposed on the base plate, and one of the plurality of transistors comprising:
    a gate electrode, disposed on the base plate;
    a first insulating layer, disposed on the gate electrode;
    an active layer, disposed on the first insulating layer, and the active layer having a channel region;
    a source electrode and a drain electrode disposed on the active layer; and
    a second insulating layer disposed on the source electrode and the drain electrode, wherein at least one of the source electrode and the drain electrode comprising:
      a first conductive layer, disposed on the active layer; and
      a second conductive layer, disposed on the first conductive layer, wherein
      the second conductive layer comprises copper;
    wherein the first conductive layer includes a first protrusion portion exposed by the second conductive layer, and the first protrusion portion has a first bottom surface and a first sidewall, and
    wherein the first bottom surface contacts the active layer, and the first sidewall contacts the second insulating layer;
    wherein the second conductive layer has a second sidewall and a second bottom surface, the second sidewall is adjacent to the channel region, wherein an angle $\theta 1$ between the first sidewall and the first bottom surface is greater than an angle $\theta 2$ between the second sidewall and the second bottom surface.

12. The transistor array substrate according to claim 11, wherein a length of the first protrusion portion is equal to or less than 0.36 μm.

13. The transistor array substrate according to claim 11, wherein a length of the first protrusion portion is ranged from 20% to 100% of a thickness of the second conductive layer.

14. The transistor array substrate according to claim 11, wherein the gate electrode comprises a lower conductive layer disposed on the base plate and an upper conductive layer disposed on the lower conductive layer, wherein the lower conductive layer includes a second protrusion portion protruding from an edge of the upper conductive layer, and the second protrusion portion has a top surface exposed by the upper conductive layer.

15. The transistor array substrate according to claim 14, wherein a first length of the first protrusion portion is greater than a second length of the second protrusion portion.

16. The transistor array substrate according to claim 11, wherein an outer edge of the active layer extends beyond an outer edge of the gate electrode.

17. The transistor array substrate according to claim 11, wherein at least one of the source electrode and the drain electrode covers a portion of a lateral surface of the active layer.

18. The transistor array substrate according to claim 11, wherein the first conductive layer covers a portion of a lateral surface of the active layer.

* * * * *